United States Patent [19]

Hihi

[11] Patent Number: 4,965,488

[45] Date of Patent: Oct. 23, 1990

[54] LIGHT-SOURCE MULTIPLICATION DEVICE

[76] Inventor: Bachir Hihi, 1888 Peeler Rd., Dunwoody, Ga. 30338

[21] Appl. No.: 328,639

[22] Filed: Mar. 27, 1989

[51] Int. Cl.[5] .............................................. H01L 33/00

[52] U.S. Cl. .................................... 313/499; 313/111; 313/110; 362/800

[58] Field of Search ............... 313/499, 500, 111, 110; 362/800, 215, 339, 309

[56] References Cited

U.S. PATENT DOCUMENTS 3,737,647 6/1973 Gomi .............................. 362/800 X
3,821,590 6/1974 Kosman et al. ..................... 313/499
4,698,730 10/1987 Sakai et al. ..................... 313/499 X

*Primary Examiner*—Palmer C. DeMeo
*Attorney, Agent, or Firm*—Needle & Rosenberg

[57] ABSTRACT

A light-source multiplication device having a light transmissive portion including one substantially planer face and an opposite face with multiple facets, a light emitting diode for generating light juxtaposed with and directed towards the light transmissive portion, wherein the facets on the light transmissive portion are angled such that images of light from the light emitting diode project in parallel from each facet.

14 Claims, 3 Drawing Sheets

LIGHT-SOURCE MULTIPLICATION DEVICE

BACKGROUND OF THE INVENTION

The present invention relates to a light-source multiplication device, and more particularly to devices which may be used in traffic signals, warning devices, and other lighted displays.

U.S. Pat. No. 4,271,408 relates to a colored-light emitting display utilizing a plurality of light emitting diodes and a reflector member for use of a traffic signal device with the power dissipation and maintenance care being reduced by the light emitting diodes (LEDs) which have low power consumption and a long service life. Such displays, however, requires many LEDs.

U.S. Pat. No. 4,684,919 to Hihi discloses a light-source multiplication device comprised of a light transmissive prism portion having front and rear facets having apices on an imaginary spherical surface and at least one light-source disposed at the rear of said light transmissive portion and adjacent to one of said facets for transmitting light through the prism to form a visible image at a plurality of predetermined facets at the front of the light transmissive portion. While this device is operable, it requires a large prism portion, at least having length at equal to the diameter of the related imaginary sphere, and correspondingly results in wasted materials. Furthermore, the device of U.S. Pat. No. 4,684,919 has a parabolic-shaped mirror portion for reflecting the image of the LED to adjacent faces to the face to which the LED is in direct proximity. U.S. Pat. No. 4,684,919 discloses an LED having a relatively low power, and a relatively wide field of vision, such that some light dispersed from the end of the LED could be picked up by the parabolic mirror. Recent developments in LED technology have resulted in LEDs having significantly increased luminosity and a much more narrow field of vision or dispersion.

Therefore, there exists a need for an improved light-source multiplication device which is dimensionally narrow.

There exists a further need for such a device which takes advantage of LEDs having relatively high intensity.

SUMMARY OF THE PRESENT INVENTION

In accordance with the present invention, an improved light-source multiplication device comprises a light transmissive element having facets on a front portion and a substantially planer rear face, in conjunction with an LED and an inverse conical reflective collar, or mirror, around the base of the LED.

The facets of the front face of the light transmissive portion preferably form a honeycomb, with all facets appropriately angled to make the single LED light source appear in all facets to a viewer generally in front of the device. The light transmissive portion should be thin, and is only required to be that thickness defined by the surface of the facets on the front portion and a rear planar face connecting the outer edges of the facets of the front portion.

The LED is thus positioned a given distance behind and remote from the rear face of the light transmissive portion for transmitting light to form visible images at a plurality of facets at the front of said light transmissive portion. A high luminosity LED will have a relatively narrow field of vision, but it will also generate light radially perpendicular to its axis at two points—at the tip and generally at the middle of its length. A conical mirror which reflects this radial light from both the tip of the LED as well as the middle of the LED provides additional light to each facet of the device, further aiding the multiplication of the light.

The light multiplication device can be used in traffic lights or in various display boards as a low power alternative to the normal lighting used in such devices.

DETAILED DESCRIPTION OF THE PREFERRED EMBODIMENT

The preferred embodiment is now described in detail with reference to the drawings, wherein like numbers represent like parts.

Figure 1:
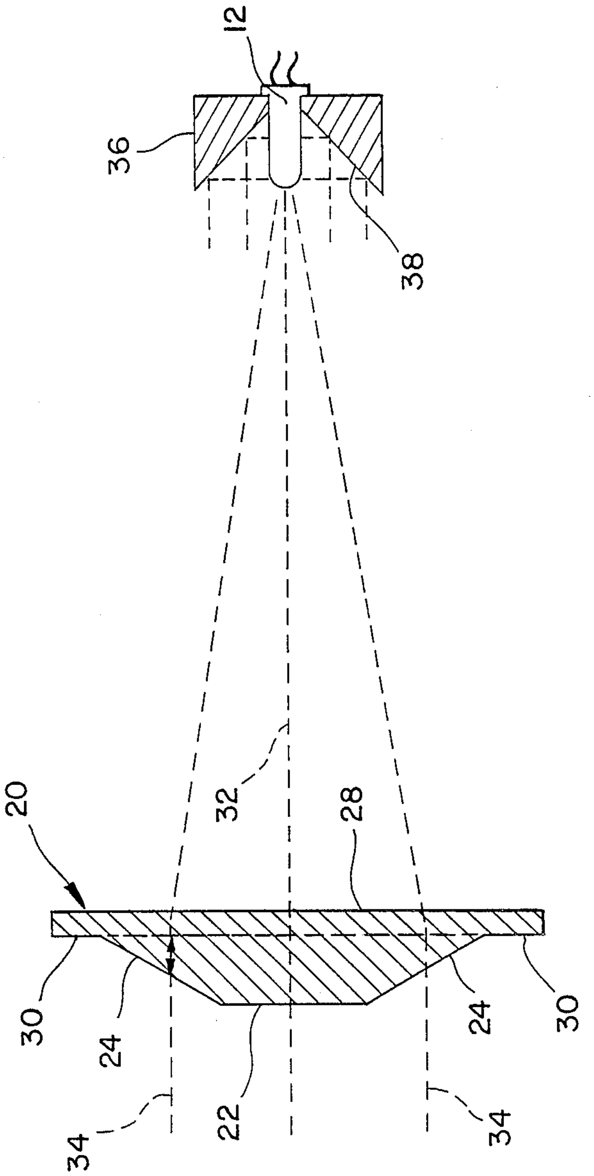
FIG. 1 is a cross-sectional view of the device of the present invention.

Referring to FIG. 1, a light transmissive portion or element 20 has a front face having a central facet 22, surrounded by multiple angled facets 24. The light transmissive portion also has a substantially planar rear face 28 opposite the front face. Attachment flange 30 may also be provided for attaching the light transmissive portion 20 by screws, bolts or other attachment means to a base or other supporting means. The thickness of the light transmissive portion 20 between central facet 22 and rear face 28 is approximately that required by connecting the outer edges of facets 24. In FIG. 1, this thickness is increased slightly by the thickness of flange 30. The light transmissive portion 20 should be transparent and may be a molded plastic, glass, or other such material.

The central facet 22 preferably is parallel to the rear face. The angled facets 24 are angled to refract a light source 12 located a fixed distance behind the rear face on the axis line 30 so that the image of the light source in each facet 24 is projected from the facets on lines 32 parallel to the axis 30 such that a viewer distant from the light multiplication device will see the light source in each facet 22, 24, thus providing a light multiplication equal to the number of facets, and enabling the invented device to be used to generate a relatively bright light from a single low intensity light source. Of course, the number of facets can be increased, either by providing more facets 24 around the central facet 22, or by providing additional properly angled facets vertically outward from the facets 24.

An LED 12 is used as the low power light source. Energy may be provided by either an external source, or by batteries or solar power associated with the device. Imaginary lines 32 and 34 show the path of the light projected from the LED 12 and refracted through the light transmissive portion 20. Since path 32 is coextensive with the axis and enters and leaves the light transmissive portion 20 at a perpendicular angle, no refraction occurs. Paths 34 must be within the field of vision of the LED 12, and light traveling along this path is refracted upon entering and leaving the light transmissive portion 20. In order to have the light paths all leave portion 20 in parallel, the facets 24 must be angled appropriately based upon the refractive index of the material of which the light transmissive portion is made and the distance the LED 12 is from the rear face 28 of the light emissive portion 20.

Figure 2:
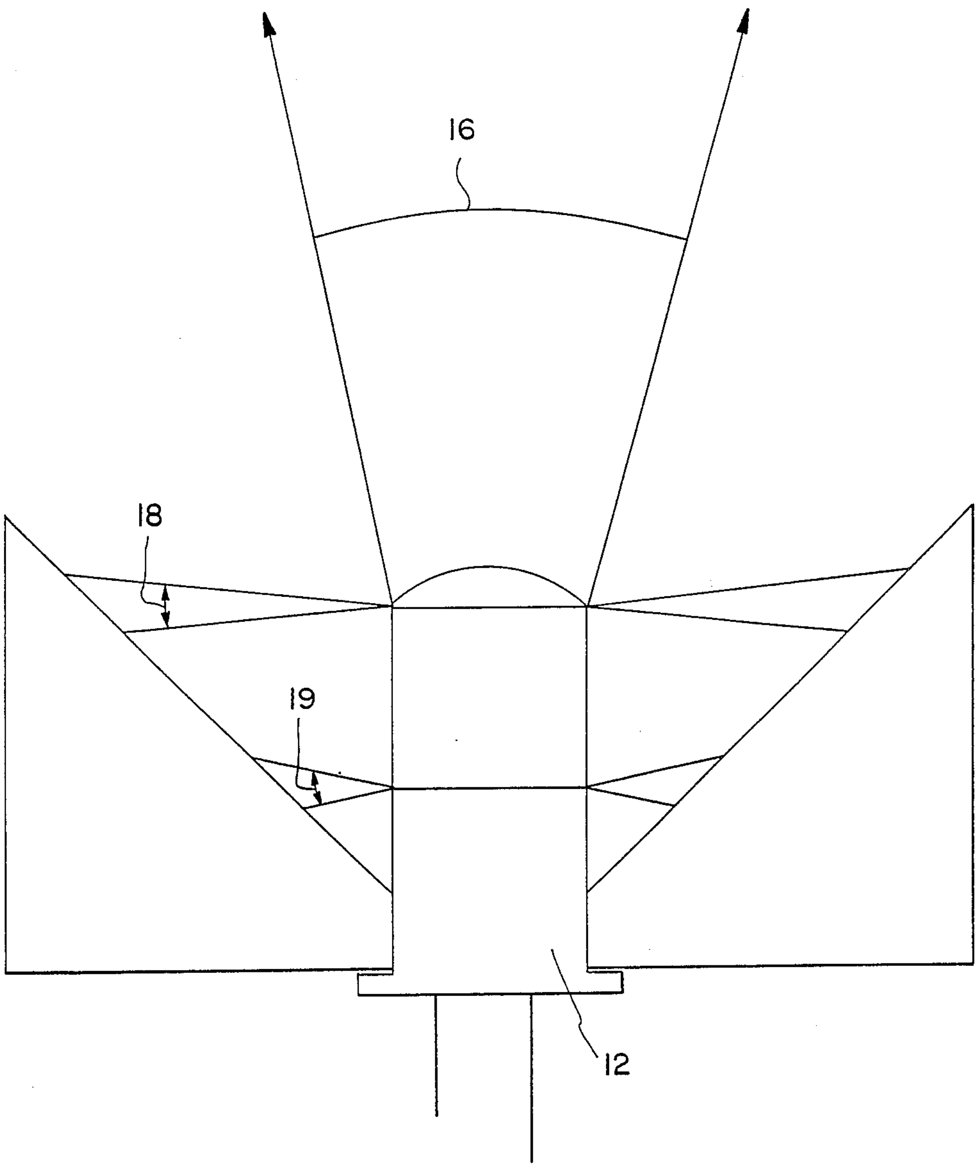
FIG. 2 is illustrates the field of vision of a high intensity LED, in combination with a cross-section of a reflective collar.

FIG. 2 illustrates the field of vision of a high intensity LED 12. The main source of light comes from the face 14 of the LED 12. The light from the face 14 is projected forward in a conical field of vision 16. In addition, the LED 12 projects some of its light sideways. That is, light is projected radially from the LED at two points. A field of vision of light emanating radially from the tip of the LED is shown as 18, and the second radial field of vision 19 comes from light generated central of the length of LED 12.

A reflecting collar 36 around the LED 12 is used to reflect forward the additional radially generated light. The collar is formed as an inverse cone with a central opening for inserting the LED. The angle formed between the reflecting face 38 of the collar 36 and the axis of the LED should be approximately 45 degrees, so that the radial light from the tip and the center of the LED is directed forward.

Figure 3:
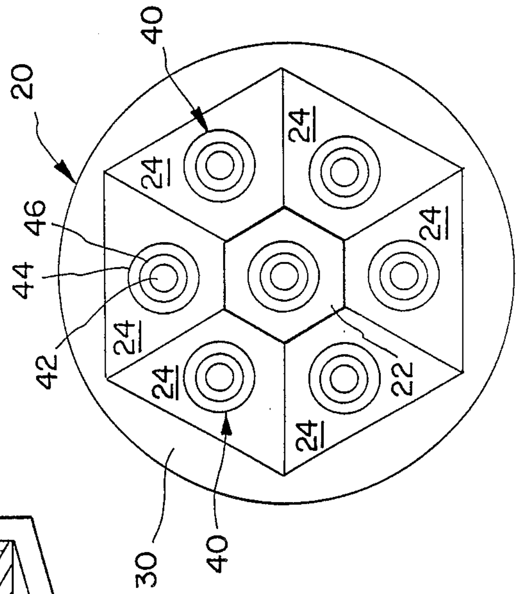
FIG. 3 is a front elevational view of the light-source multiplication device of the present invention.

FIG. 3 is a front view of the invention, showing seven images 40 of the light source, one in each facet 22,24. Each image includes the face 42 of the LED along with two rings which are the reflections from the reflecting collar of the radial light from the tip 44 and from the center 46 of the LED.

As noted, the pattern of facets on the front face of the light transmissive portion 20 may be varied in number and shape so as to provide a wide ranging number of images. Also, it should be recognized that the light transmissive portion 20 can be viewed so that the planar face 28 is forward and the faceted face is rearward.

Figure 4:
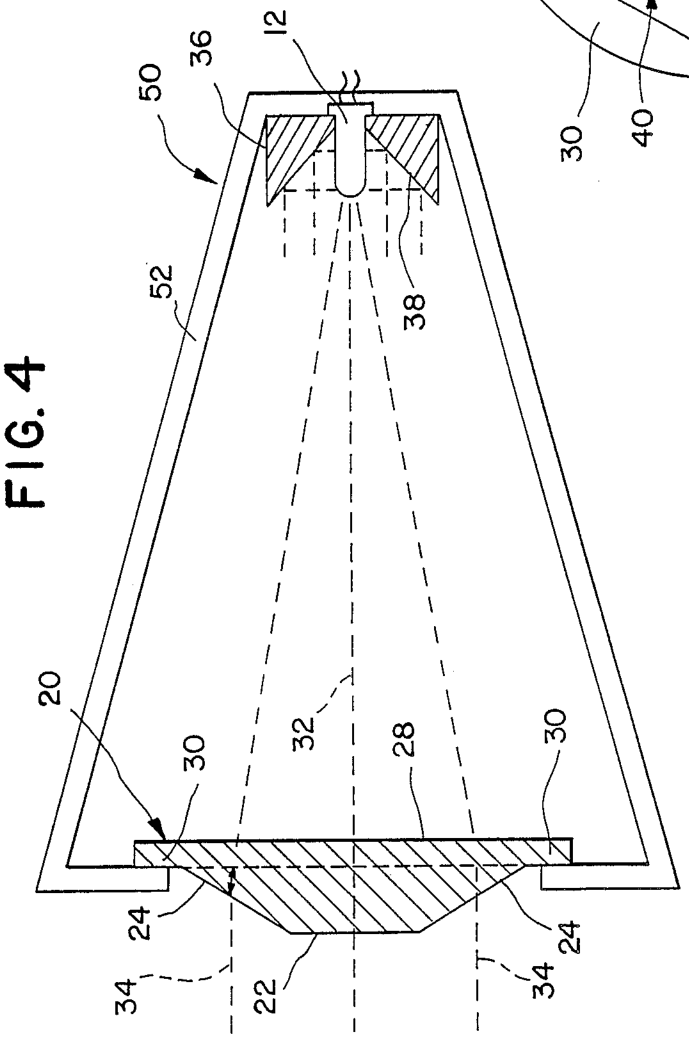

FIG. 4 illustrates a display 50 having a housing 52 supporting the light transmissive portion 20, the reflecting collar 36 and LED 12. In alternate embodiments of displays, the housing 52 may be greatly reduced in size to hold only the light transmissive portion 20, and the collar 36 and LED 12 may be separately supported.

While the invention has been described in detail with reference to the preferred embodiment thereof, it will be understood that variations and modifications can be made effected within the spirit and scope of the invention as previously described and as defined by the claims.

What is claimed is:

1. A light-source multiplication device comprising:

(a) a light transmissive element including one substantially planar face and an opposite face with multiple facets; and (b) a light emitting diode for generating light; said diode being spaced from said element such as to direct light towards said planar face wherein the facets on said light transmissive element are angled such that images of light from said light emitting diode project in parallel from each facet.

2. The device of claim 1, which further comprises an inverse conical reflective collar surrounding said light emitting diode such that light which emanates radially from said light emitting diode is reflected towards said light transmissive element.

3. The device of claim 2, wherein said light emitting diode is a high intensity diode with a narrow field of vision and also generates light radially as its tip and from its center.

4. The device of claim 2, wherein the angle of said reflective collar is about 45 degrees.

5. The device of claim 1, wherein the thickness of said light transmissive element is substantially determined by the angled facets.

6. The device of claim 2, wherein said light emitting diode is located remote from said light transmissive element.

7. A display comprising:

(a) a housing;

(b) a light transmissive element provided on said housing, said element including one substantially planar face and an opposite face with multiple facets; and (c) a light emitting diode for generating light, said diode being spaced from said element such as to direct light towards said planar face wherein the facets on said light transmissive element are angled such that images of light from said light emitting diode project in parallel from each facet.

8. The display of claim 7, wherein said housing further provides support from said light emitting diode.

9. The display of claim 7, which further comprises an inverse conical reflective collar surrounding said light emitting diode such that light which emanates radially from said light emitting diode is reflected towards said light transmissive element.

10. The display of claim 9, wherein said housing further provides support for said reflective collar.

11. The display of claim 9, wherein said light emitting diode is a high intensity diode with a narrow field of vision and also generates light radially at its tip and from its center.

12. The display of claim 9, wherein the angle of said reflective collar is about 45 degrees.

13. The display of claim 7, wherein the thickness of said light transmissive element is substantially determined by the angled facets.

14. The display of claim 9, wherein said light emitting diode is located remote from said light transmissive element.

* * * * *